United States Patent
Gagnon et al.

(10) Patent No.: US 8,170,629 B2
(45) Date of Patent: May 1, 2012

(54) FILTER HAVING IMPEDANCE MATCHING CIRCUITS

(75) Inventors: Eric Gagnon, Chelsea (CA); Chun-Yun Jian, Ottawa (CA)

(73) Assignee: Rockstar Bidco, LP, New York, NY (US)

( * ) Notice: Subject to any disclaimer, the term of this patent is extended or adjusted under 35 U.S.C. 154(b) by 0 days.

(21) Appl. No.: 13/007,708

(22) Filed: Jan. 17, 2011

(65) Prior Publication Data

US 2011/0109403 A1    May 12, 2011

Related U.S. Application Data

(63) Continuation of application No. 11/985,812, filed on Nov. 16, 2007, now Pat. No. 8,060,156.

(60) Provisional application No. 60/866,118, filed on Nov. 16, 2006, provisional application No. 60/867,272, filed on Nov. 27, 2006.

(51) Int. Cl.
*H04M 1/00* (2006.01)
*H04B 1/38* (2006.01)

(52) U.S. Cl. ............. 455/575.1; 455/90.3; 455/128; 455/347; 156/184; 242/532.3; 242/535; 242/580; 242/521; 242/542

(58) Field of Classification Search ............ 455/575.1, 455/90.3, 128, 347; 156/184; 242/532.3, 242/535, 580, 521, 542
See application file for complete search history.

(56) References Cited

U.S. PATENT DOCUMENTS

| | | |
|---|---|---|
| 6,271,579 B1 | 8/2001 | Going |
| 6,417,574 B1 | 7/2002 | Misawa |
| 2004/0124953 A1 | 7/2004 | Nakatani |
| 2005/0122187 A1 | 6/2005 | Ohashi |
| 2005/0237130 A1 | 10/2005 | Iwamoto |
| 2006/0091977 A1 | 5/2006 | Inoue |

OTHER PUBLICATIONS

Canadian Patent Office, International Search Report and Written Opinion for International Application No. PCT/IB2007/004670, 8 pages, Feb. 9, 2009.
Wikipedia definition for "Interdigital transducer," http://en.wikipedia.org/wiki/Interdigital_transducer, p. 1 (at least as early as Oct. 10, 2007).
Wikipedia definition for "Surface acoustic wave," http://en.wikipedia.org/wiki/Surface_acoustic_wave, pp. 1 2 (at least as early as Oct. 10, 2007).
Integrated Publishing, Electrical Engineering, "Band Reject Filter," http://www.tpub.com/content/neets/14181/css/14181_51.htm, pp. 1 2 (at least as early as Oct. 10, 2007).
http://www.electronics-manufacturers.com/info/microwave-electronics/saw-filter.html, "Saw Filter," pp. 1 2 (Nov. 17, 2006).

*Primary Examiner* — Wen Huang
(74) *Attorney, Agent, or Firm* — Conley Rose, P.C.; Rodney B. Carroll; Bernard Tiegerman (57) ABSTRACT

A filter package is provided with a support structure, a filter device having terminals, impedance matching circuits formed on the support structure and electrically connected to at least some of the terminals of the filter device, and at least one electrical ground structure electrically connected to the impedance matching circuits. Moreover, the filter package has an outer housing to contain the support structure, filter device, impedance matching circuits, and at least one ground structure.

20 Claims, 7 Drawing Sheets

FILTER HAVING IMPEDANCE MATCHING CIRCUITS

CROSS-REFERENCE TO RELATED APPLICATIONS

This application is a continuation of U.S. Ser. No. 11/985,812 filed Nov. 16, 2007 now U.S. Pat. No. 8,060,156, which claims the benefit under 35 U.S.C. §119(e) of U.S. Provisional Application Ser. No. 60/866,118 filed Nov. 16, 2006, and U.S. Provisional Application Ser. No. 60/867,272 filed Nov. 27, 2006, which are all hereby incorporated by reference.

TECHNICAL FIELD

The invention relates generally to a filter for use in a wireless communications device.

BACKGROUND

Wireless communications devices, such as wireless terminals or wireless base stations, include wireless transceivers to perform wireless communications, such as radio frequency (RF) communications. A wireless transceiver commonly includes one or more filters, such as a band pass filter, a band reject filter, or other types of filters. A band reject filter is used to reject or attenuate signals having frequencies within a particular band, while allowing frequencies outside the band to pass through. A band pass filter, on the other hand, allows frequencies within a band to pass through, while rejecting or attenuating signals having frequencies outside the band. Other types of filters include low pass filters, high pass filters, and so forth.

Certain types of high performance filters use external impedance matching circuits that are connected to terminals of the filter. An "external" matching circuit refers to a matching circuit that is located outside a package of the filter. An issue associated with using external matching circuits is that impedances associated with electrical connecting structures between electronic circuitry inside the filter package and the external matching circuits can limit effectiveness of the filter at higher frequencies. Therefore, many conventional filters may not be effectively used in high-frequency wireless communications devices. Moreover, due to issues associated with external matching circuits, some high performance filters may simply omit the use of matching circuits for some terminals of the filters, which can come at the expense of reduced filter performance.

SUMMARY

In general, a filter package has an outer housing, a support structure, and a filter device having plural terminals. Matching circuits formed on the support structure are electrically connected to at least some of the plural terminals of the filter device. The matching circuits are electrically connected to at least one electrical ground structure. The support structure, filter device, matching circuits, and at least one ground structure are contained in the outer housing.

Other or alternative features will become apparent from the following description, from the drawings, and from the claims.

DETAILED DESCRIPTION

In the following description, numerous details are set forth to provide an understanding of some embodiments. However, it will be understood by those skilled in the art that some embodiments may be practiced without these details and that numerous variations or modifications from the described embodiments may be possible.

In accordance with some embodiments, a filter package includes an outer housing containing a filter device and internal impedance matching circuits that are electrically connected to the filter device. The filter device can be a "high frequency" filter device in some example implementations. A "high-frequency" filter device is able to operate at relatively high frequencies, such as in the gigahertz (GHz) range. As examples, such high-frequency filter devices include surface acoustic wave (SAW) filter devices, bulk acoustic wave (BAW) filter devices, and other types of filter devices. In some examples, the filter devices are designed to be band rejection filter devices, in which signals having frequencies within a band of frequencies are rejected (or attenuated), whereas signals having frequencies outside the band of frequencies are accepted (or allowed to pass through the filter device). Another type of filter device is a band pass filter device, in which signals having frequencies within the band are allowed to pass through the filter device, whereas signals having frequencies outside the band are rejected (or attenuated). In other implementations, other types of filter devices can be employed, such as low pass filter devices, high pass filter devices, and so forth.

The filter package can be used in a wireless communications device or in some other type of electronic device.

In accordance with some embodiments, internal impedance matching circuits contained within the outer housing of a filter package provide for higher quality impedance matching and allow for more effective operations at high frequencies (e.g., in the GHz range such as 1 GHz or greater). The internal impedance matching circuits can be in the form of matching transmission lines or discrete matching components. The matching circuits are electrically connected to as least one ground structure within the filter package outer housing. By providing internal matching circuits that can be connected to an internal ground structure, external matching components (located outside the filter package outer housing) can be avoided or reduced. Providing internal matching circuits allows for electrical connection structures between the inside of the filter package and external matching components to be omitted or reduced, which is beneficial since such electrical connection structures tend to introduce discontinuity, as well as parasitic and resistive losses that may adversely affect filter device performance at higher frequencies. For example, resistances introduced by such electrical connection structures can cause unacceptable passband loss. Also, by providing matching circuits internally within the filter package and avoiding or reducing external matching components, the footprint taken up by the filter package and associated circuitry can be reduced to provide for more efficient usage of space of a circuit board on which the filter package is to be mounted. Also, by reducing the number of external matching components that have to be electrically coupled to the filter device, manufacturing yield of circuit boards can be improved (by reducing the number of components on the circuit board) and test repeatability (as well as performance) can be improved. This can lead to enhanced efficiencies during mass production or manufacture.

Figure 1A:
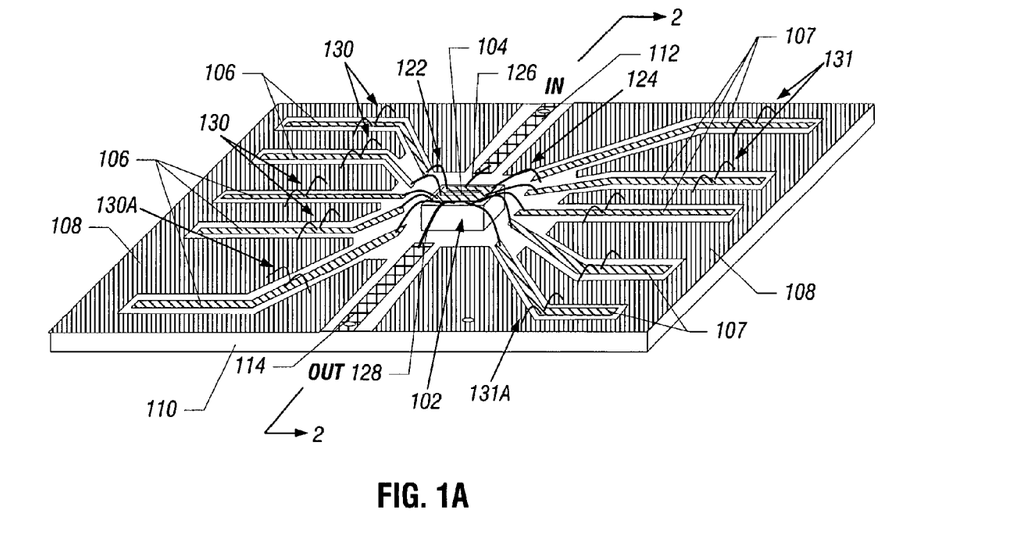
FIG. 1A is a perspective view of a substrate assembly for use in a filter package with internal matching circuits, according to an embodiment.

FIG. 1A is a perspective view of a substrate assembly that can be provided within a filter package according to an embodiment. The substrate assembly depicted in FIG. 1A include a substrate carrier 110 (or other type of support structure) on which is mounted a filter device 102. In the embodiment of FIG. 1A, the bottom surface of the filter device 102 is mounted on an upper surface of the substrate carrier 110. In different embodiments, other forms of attachment between the filter device 102 and the substrate carrier 110 can be provided, as discussed further below.

An upper surface 104 of the filter device 102 provides various contact terminals (where each contact terminal is formed of an electrically conductive material) that are electrically connected to internal nodes of the filter device 102. In an alternative implementation, the contact terminals can be provided on other parts of the filter device 102. Two of the contact terminals provided on the upper surface 104 of the filter device 102 are an input terminal and an output terminal that are electrically connected by bond wires 126 and 128, respectively, to an input transmission line 112 and an output transmission line 114, respectively. The input transmission line 112 is electrically connected to receive an input signal from outside the filter package, and the output transmission line 114 is to provide an output signal (after filtering applied by the filter device 102 on the input signal) to the outside of the filter package. In the embodiment of FIG. 1A, the transmission lines 112 and 114 can be much shorter and closer to bond wires 124 and 124 to further minimize resistive losses. In a typical implementation, the filter package is mounted on a circuit board. The input and output signals are signals provided over conductive traces of the circuit board.

The upper surface 104 of the filter device 102 also has other contact terminals that are electrically connected by bond wires 122 to corresponding matching transmission lines 106, and by bond wires 124 to corresponding matching transmission lines 107. In the depicted embodiment, the matching transmission lines 106 and 107 are provided on the upper surface of the substrate carrier 110 (as are the input and output transmission lines 112, 114). Typically these matching transmission lines are relatively short, to provide relatively small values of inductance, and to provide a relatively high quality factor (e.g., low resistive loss can be important for reducing pass band losses). The matching transmission lines 106, 107 can be any one of microstrip lines (where a microstrip line is a conducting strip separated from a ground plane by a dielectric layer), striplines (where a stripline is a conducting strip sandwiched between two parallel ground planes separated from the conducting strip by dielectric), coplanar waveguide lines (a conductor separated by a pair of coplanar ground lines), or other types of transmission lines.

As discussed further below, the transmission lines 106, 107 can also (or alternatively) be provided on the bottom surface of the substrate carrier 110 in other implementations. As yet another alternative, the substrate carrier 110 can be omitted with the transmission lines formed on an inner surface of the filter package outer housing. Alternatively, instead of using matching transmission lines, discrete components can be used instead to provide impedance matching. Examples of impedance matching discrete components include resistors, capacitors, and inductors. More generally, the matching transmission lines and/or matching discrete components are referred to as "matching circuits," which are generally circuits (either in the form of transmission lines or in the form of discrete components, or both) that are used to provide impedance matching. The matching circuits provide relatively small high-Q matching inductances that are useful for reducing pass band loss.

Although not depicted in FIG. 1A, note that at least some of the matching transmission lines 106, 107 can also be electrically connected to discrete matching components, if desired.

As further depicted in FIG. 1A, a ground plane 108 is provided on the upper surface of the substrate carrier 110, with the ground plane 108 having openings to receive the transmission lines 106, 107 and the input and output transmission lines 112, 114. Note that gaps are provided between sides of the transmission lines 106, 107, 112, 114, and the ground plane 108. To electrically connect the matching transmission lines 106, 107 to the ground plane 108, bond wires 130 (one set of bond wires 130 is labeled 130A) and 131 (one set of bond wires 131 is labeled 131A) can be used. Shunting the transmission lines 106, 107 to ground using the bond wires 130, 131 of FIG. 1A allows for provision of high-Q inductors.

The bond wires 130 electrically connect the matching transmission lines 106 to the ground plane 108, whereas the bond wires 131 electrically connect the transmission lines 107 to the ground plane 108. As depicted in FIG. 1A, each matching transmission line 106, 107 is electrically connected by a corresponding pair of bond wires to the ground plane 108. In different implementations, each transmission line 106, 107 can be electrically connected by just one bond wire to the ground plane 108, or alternatively, by more than two bond wires to the ground plane 108.

The connection point of a set of one or more bond wires to a matching transmission line 106 or 107 can be varied to achieve a desired electrical length of the transmission line. By moving the connection point of the set of one or more bond wires to the matching transmission line 106 or 107 further away from the filter device 102, a longer electrical length of the transmission line is provided. On the other hand, by moving the connection point of the set of one or more bond wires to the matching transmission line closer to the filter device, a shorter length of the transmission line is provided. Effectively, by varying the electrical length of the matching transmission line, the amount of inductance that is electrically connected to a corresponding contact terminal of the filter device is varied. Each transmission line 106 or 107 can be considered a shunt stub that is tunable to a specific electrical length by shorting the transmission line to ground at a desired location of the transmission line. In the example of FIG. 1A, note that the connection point of the pair of bond wires 130A to the corresponding matching transmission line 106 is closer to the filter device 102 than the connection point of the pair of bond wires 131A to the corresponding transmission line 107. Therefore, the electrical length of the transmission line 106 connected to bond wires 130A is shorter than the electrical length of the transmission line 107 connected to bond wires 131A. Note that in the example of FIG. 1A, the electrical lengths of the transmission lines 106, 107 correspond to physical lengths shorter than the physical lengths of the transmission lines 106, 107, due to locations of the connection points of the bond wires 130, 131 away from the ends of the transmission lines.

During manufacturing of the filter package, the locations of the connection points of the bond wires to different matching transmission lines can be tuned according to the impedance matching needs of the different contact terminals of the filter device 102. Such tuning can provide more effective matching circuits to improve performance of the filter package. By using internal matching circuits according to some embodiments, filter performance can be optimized for various internal nodes of the filter device. The impedance matching for the contact terminals of the filter device can be performed inside the filter package, close to the filter device, such that a smaller resistive loss and less inherent parasitic are associated with the matching circuits and filter package. Moreover, the impedance matching can be performed with high accuracy and high repeatability since the electrical lengths of matching transmission lines can be tuned for different contact terminals of the filter device.

The ground plane 108 and the transmission lines 106, 107 can be formed on the upper surface of the substrate carrier 110 by depositing an electrically conductive layer on the upper surface of the substrate carrier 110 and etching the deposited electrically conductive layer to provide the ground plane 108, transmission lines 106, 107, and transmission lines 112, 114. In other implementations, other techniques of forming the ground plane 108 and transmission lines 106, 107, 112, and 114 can be used.

Note that the substrate carrier 110 can be formed of a dielectric material (that is electrically insulating), such as ceramic or the like.

Figure 1B:
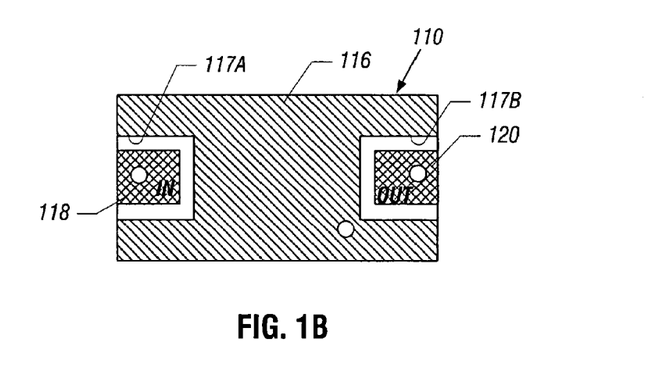
FIG. 1B is a bottom view of the substrate assembly of FIG. 1A.

FIG. 1B shows the bottom view of the substrate carrier 110 of FIG. 1A, where the bottom view has a ground plane 116 with cutouts 117A and 117B to allow for an input contact pad 118 and an output contact pad 120 provided on the bottom surface of the substrate carrier 110. The input contact pad 118 and the output contact pad 120 are electrically connected to electrically conductive structures (depicted in FIGS. 2 and 3 and discussed below) to allow for the input and output pads 118, 120 to receive and transmit input and output signals, respectively. The small circles in FIG. 1B represent vias to interconnect the input contact pad 118, the output contact pad 120, and the ground plane 116, to the input transmission line 112, output transmission line 114, and ground plane 108, respectively.

The ground plane 116 and the input and output contact pads 118, 120 can be formed by depositing an electrically conductive layer on the lower surface of the substrate carrier 110, and then etching the deposited electrically conductive layer to form the ground plane 116 and input and output contact pads 118, 120.

Figure 2:
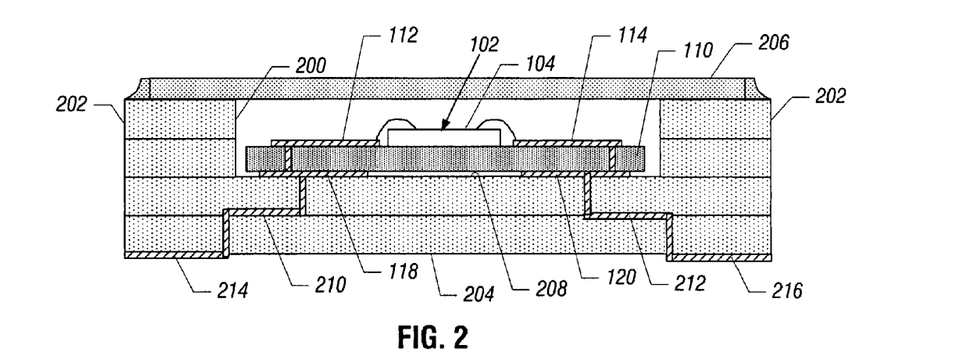
FIGS. 2 and 3 are cross-sectional views of different embodiments of a filter package.

FIG. 2 shows the substrate assembly depicted in FIGS. 1A-1B provided in a chamber 200 defined by an outer housing of the filter package. The outer housing includes side walls 202, a bottom segment 204, and a top cap 206 (or other covering structure). The outer housing can be formed of an electrically insulating material such as ceramic or the like. During manufacture of the filter package, the substrate assembly that includes the substrate carrier 110 and the filter device 102 is first provided into the chamber 200 of the outer housing. The input and output contact pads 118, 120 on the bottom surface of the substrate carrier 110 are electrically connected to package interconnect structures 210 and 212, respectively, which extend through the lower segment 204 of the outer housing to electrically connect to external pads 214, 216, respectively. The package interconnect structures can include vias (vertical interconnect structures) and an internal metal layer (horizontal interconnect structure). Note that the base 208 provided by the bottom segment 204 can provide connection pads corresponding to the contact pads 118, 120 of the substrate carrier 110. The external pads 214, 216 are electrically contacted to external electrically structures, such as electrical structures provided on a circuit board. The ground plane 116 can be attached to the housing base ground area with solder reflow or conductive epoxy or the like. The input contact pad 118 and the output contact pad 120 can also be attached to housing base pads which are connected to the external pads 214 and 216.

Once the substrate assembly is positioned on a base 208 provided in the chamber 200 of the outer housing, and the electrical connection has been made between the input and output pads 118, 120 and the package interconnect structures 210, 212, the top cap 206 can be attached to the side walls 202 of the outer housing. The top cap 206 can be adhesively attached, or attached by some other attachment or bonding mechanism, to the side walls 202 of the outer housing. Once assembled, as depicted in FIG. 2, the outer housing and the substrate assembly including the substrate carrier 110 and filter device 102 form the filter package depicted in FIG. 2. Note that the substrate assembly is completely enclosed by the outer housing made up of the top cap 206, side walls 202, and lower segment 204.

Figure 3:
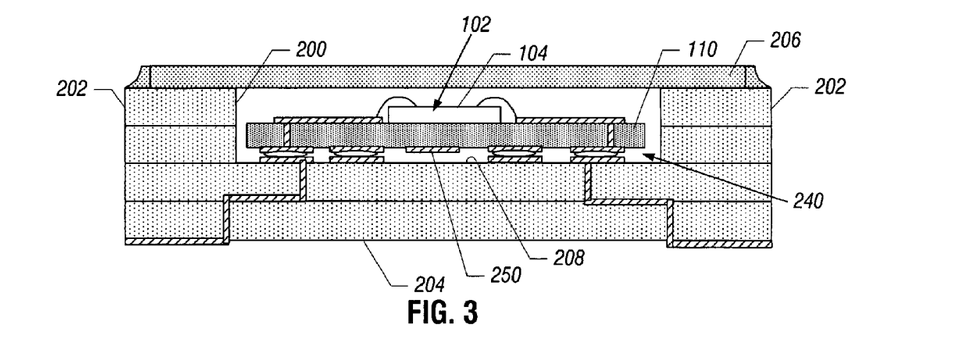

FIG. 3 shows a slightly different embodiment of the filter package. The filter package of FIG. 3 uses a different mounting mechanism between the substrate assembly and the base 208 of the lower segment 204 of the outer housing. In FIG. 3, the mounting mechanism is in the form of metal or solder bumps 240 that are electrically connected to package interconnect structures 210, 212 (FIG. 2). In the FIG. 3 embodiment, a matching transmission line 250 is depicted as being provided on the bottom side of the substrate carrier 110. Providing matching transmission line(s) on both sides of the substrate carrier 110 allows for miniaturization or reduction in size of the substrate assembly so that the filter package can be made even smaller.

As noted above, the substrate carrier 110 can be omitted in other implementations, with the filter device 102 provided directly on the base 208 of the outer housing of the filter package. In such an implementation, the matching transmission lines (similar to 106, 107) can be formed on the base 208.

In a variant of the embodiments discussed above, the input and output transmission lines 112 and 114 can be electrically connected by bond wires to leadframe pads of the package. Also, it is possible that the ground plane 108 can be connected by bond wires to ground leadframe pads of the package.

Figure 4A:
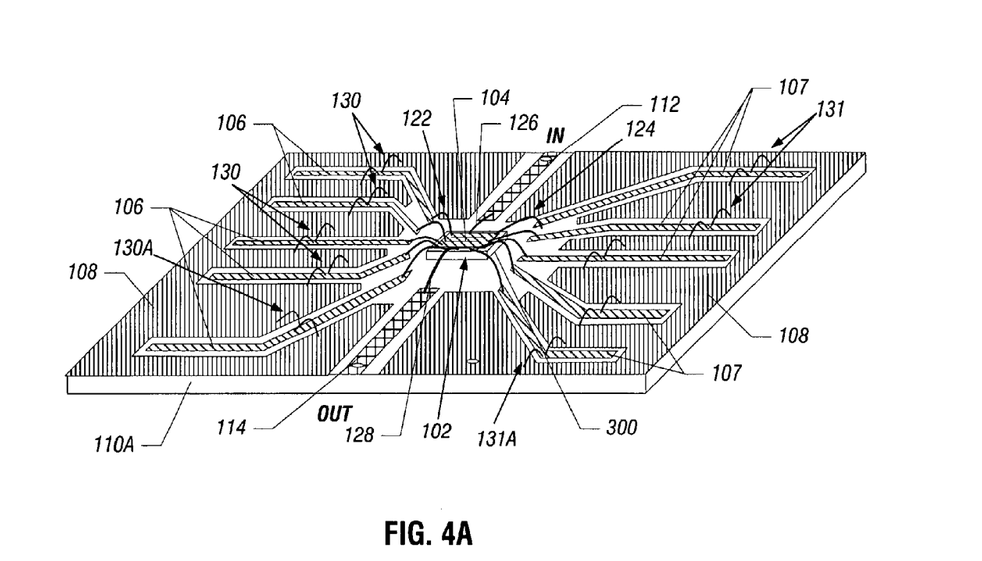
FIGS. 4A-4B, 5A-5B, 6, and 7 illustrate other embodiments of substrate assemblies used in filter packages.
Figure 4B:
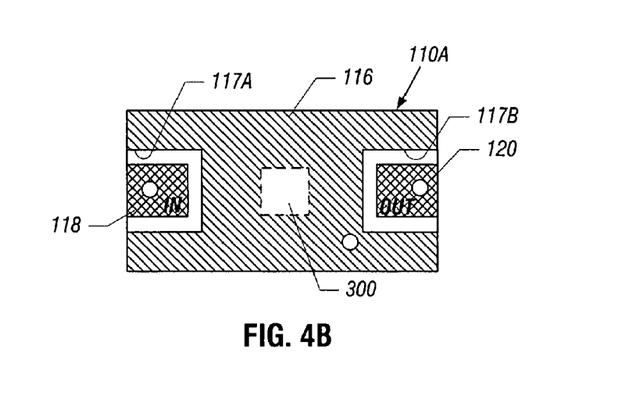

FIGS. 4A and 4B show a variation of the substrate assembly depicted in FIGS. 1A-1B, where common reference numerals are used to identify common elements. In FIGS. 4A and 4B, a cavity 300 is provided in or through the substrate carrier 110A, such that the filter device 102 can fit inside the cavity 300. The cavity 300 can extend all the way through the substrate carrier 110A, or alternatively, the cavity 300 can be a recess that does not extend all the way through the substrate carrier 110A. By providing the cavity 300, the filter device is at least slightly embedded inside the substrate carrier 110 such that the upper surface 104 of the filter device 102 is closer to the upper surface of the substrate carrier 110A. This can reduce the length of the bond wires 122, 124, 126, 128 used to electrically connect the contact terminals of the filter device 102 to the corresponding transmission lines 106, 107, 112, 114 on the substrate carrier 110A. Reducing the length of the bond wires allows for reduced inductances, which may improve high-frequency performance of the filter device 102.

Figure 5A:
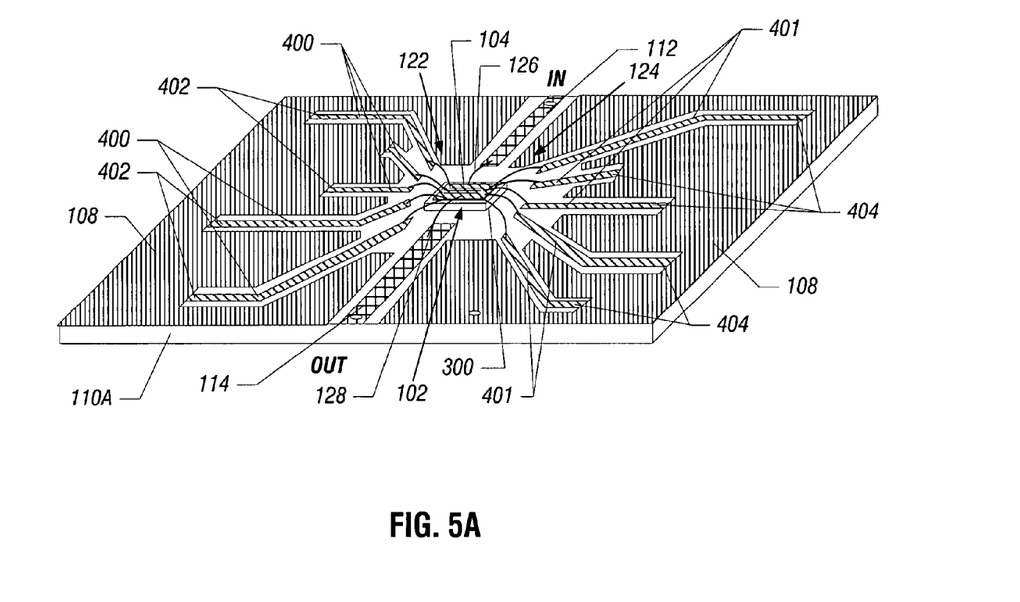
Figure 5B:
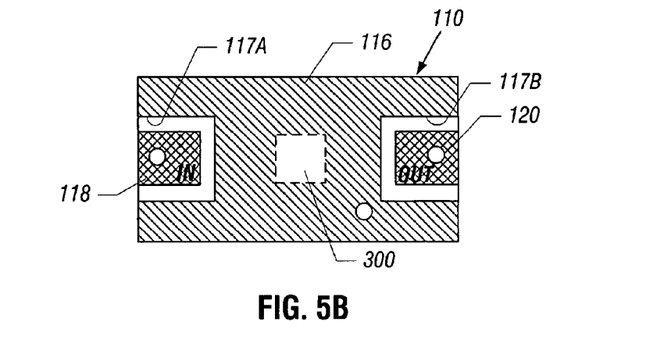

FIGS. 5A-5B illustrate a variation of the embodiment of FIGS. 4A-4B. In FIGS. 5A-5B, instead of using bond wires 130, 131 to electrically connect matching transmission lines 106, 107 to the ground plane 108, the FIG. 5A embodiment instead directly connects an end portion of matching transmission lines 400, 401 to the ground plane 108. As depicted in FIG. 5A, end portions 402 of corresponding matching transmission lines 400 are electrically contacted to the ground plane 108. Similarly, end portions 404 of corresponding matching transmission lines 401 are electrically contacted to the ground plane 108. The lengths of the matching transmission lines 400, 401 can be varied during the manufacturing process of the substrate assembly depicted in FIG. 5A to provide different electrical lengths for matching inductances electrically connected to corresponding contact terminals of the filter device 102. Note that in this embodiment, the electrical lengths of the transmission lines 400, 401 are proportional to the physical lengths of the transmission lines 400, 401.

The benefit of using the FIGS. 5A-5B embodiment is that bond wires 130, 131 do not have to be used, which can improve manufacturing yield.

Figure 6:
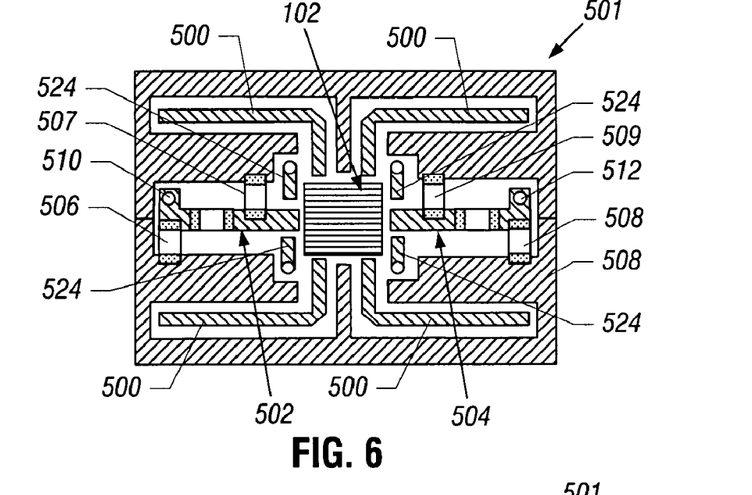

FIG. 6 is a top view of a substrate assembly including a substrate carrier 501 according to another embodiment. In FIG. 6, matching transmission lines 500 are provided for connection to corresponding contact terminals on the upper surface of the filter device 102. Bond wires electrically connecting the matching transmission lines 500 to the filter device 102 and to the ground plane 108 are not depicted for purposes of clarity. In addition, FIG. 6 shows that input and output transmission lines 502 and 504 are further electrically connected to discrete components that are used for impedance matching for the transmission lines 502, 504. In the example of FIG. 6, the input transmission line 502 is electrically connected to matching discrete components 506 and 507, which are both interconnected between the transmission line 502 and the ground plane 508. Similarly, the output transmission line 504 is electrically connected to matching discrete components 508, 509, which are both interconnected between the transmission line 504 and the ground plane 108. The discrete components can be implemented with one or more devices, such as capacitors, resistors, inductors, and so forth. Note that input transmission line 502 and output transmission line 504 may also optionally each include an intermediate discrete component between matching discrete components 506 and 507 or between matching discrete components 508 and 509.

Vias 510 and 512 are provided on corresponding transmission lines 502 and 504 to allow for the transmission lines 502, 504 to be electrically connected to input and output contact pads on the other side of the substrate carrier 501. Note that the bottom side of the substrate carrier 501 can have structures similar to that depicted in FIG. 1B in one implementation.

Although not depicted in FIG. 6, note that at least some of the matching transmission lines 500 can also be electrically connected to discrete matching components, if desired.

Figure 7:
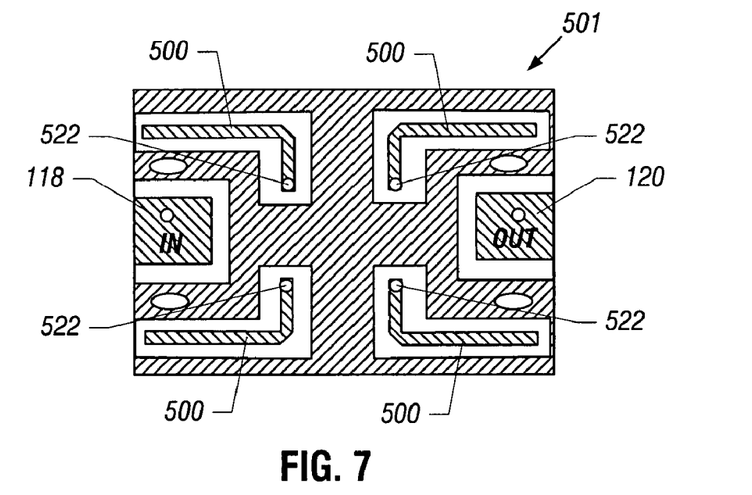

FIG. 7 shows the bottom view of a carrier structure 501 according to another embodiment. Note that the structures depicted in the bottom view of FIG. 7 can be used in conjunction with the structures in the top view of FIG. 6, or alternatively, can be used with a different arrangement on the upper surface of the substrate carrier (such as in an arrangement where matching transmission lines 500 are omitted).

The bottom view depicted in FIG. 7 shows that matching transmission lines 520 can also be provided on the bottom surface of the substrate carrier 501. These matching transmission lines 520 are electrically connected by vias 522 to corresponding electrical structures 524 (FIG. 6) on the upper surface (FIG. 6) of the substrate carrier 501.

Figure 8:
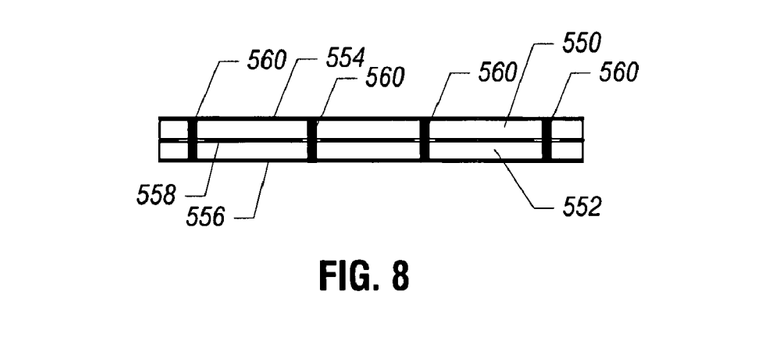
FIG. 8 is a cross-sectional view of a multi-layer substrate assembly, according to another embodiment.

FIG. 8 shows a cross-sectional view of a substrate assembly according to another embodiment. In the example of FIG. 8, two dielectric layers 550 and 552 are provided, with an electrically conductive layer 554 provided on the top surface, an electrically conductive layer 558 provided between the dielectric layers, and an electrically conductive layer 556 provided on the bottom surface. To electrically connect conductive structures on the upper layer 554 and the bottom layer 558, vias 560 can be used. The upper and lower conductive layers 554, 556, as well as the intermediate electrically conductive layer 558, can be used to implement transmission lines and/or ground planes.

Figure 9:
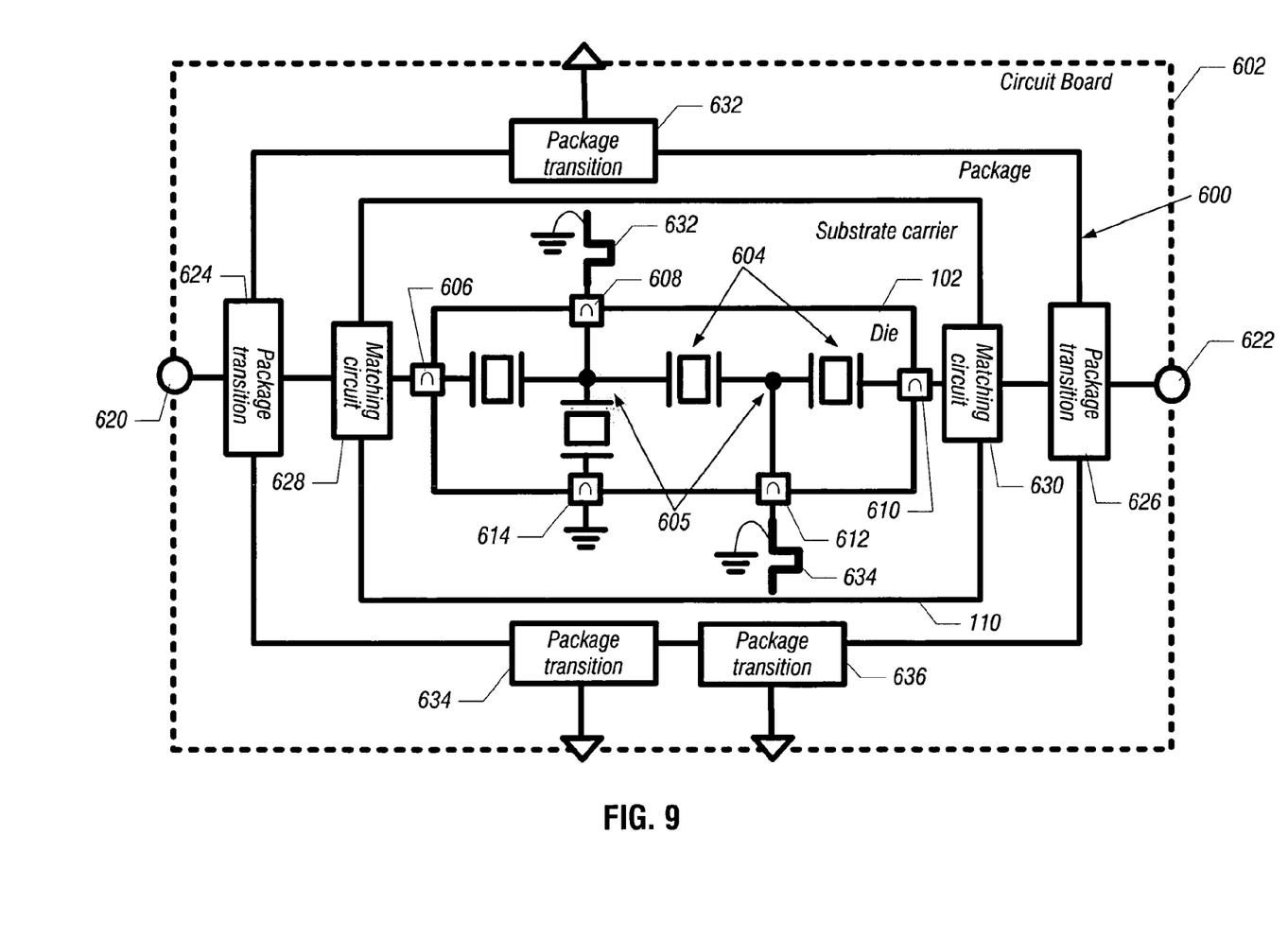
FIG. 9 is a schematic view of a filter package on a circuit board, according to an embodiment.

FIG. 9 shows an example filter package 600 provided on a circuit board 602. As depicted in FIG. 9, a substrate carrier 110 with the filter device 102 (e.g., in the form of an acoustic or microelectromechanical systems die) is provided inside the package 600.

The filter device 102 includes various internal components 604 (e.g., resonators) and internal nodes 605 that are connected to contact terminals 606, 608, 610, 612, and 614. A pad or contact point 620 on the circuit board 602 provides the input signal to the filter package 600, while a pad or contact point 622 on the circuit board 602 receives an output signal from the filter package 600. The pads or contact points 620, 622 are electrically connected through respective package transitions 624, 626 (e.g., package terminals, castellations, pins, vias, electrodes, etc.) to the substrate carrier 110. In the embodiment of FIG. 9, matching circuits 628, 630 on the substrate carrier 110 are electrically connected to corresponding contact terminals 606, 610 (such as by bond wires) of the filter device 102. Typically, the contact terminals 606, 610 are input and output contact terminals for receiving input signals and transmitting output signals, respectively.

In addition, the contact terminals 608, 612 of the filter device 102 are electrically connected to matching transmission lines 632, 634, respectively, similar to the matching transmission lines described above. Each of the matching transmission lines 632, 634 are electrically connected, such as by bond wires or by other electrical connection, to ground. Each of the transmission lines 632, 624 act as a matching inductor to the shunt resonators.

In the example of FIG. 9, the remaining contact terminal 614 of the filter device 102 is not electrically connected to a matching transmission line, but instead, is directly electrically connected to the ground plane 108. More than one contact terminal 614 can be used when multiple shunt resonators or internal components exist.

As further depicted in FIG. 9, the filter package 600 can further have package transitions 632, 634, 636 (e.g., package terminals, castellations, vias, pins, electrodes, etc.) that are electrically connected to external ground (ground of the circuit board 602). The ground plane(s) inside the filter package 600 is (are) electrically connected through these package transitions 632, 634, 636 to external ground.

Figure 10:
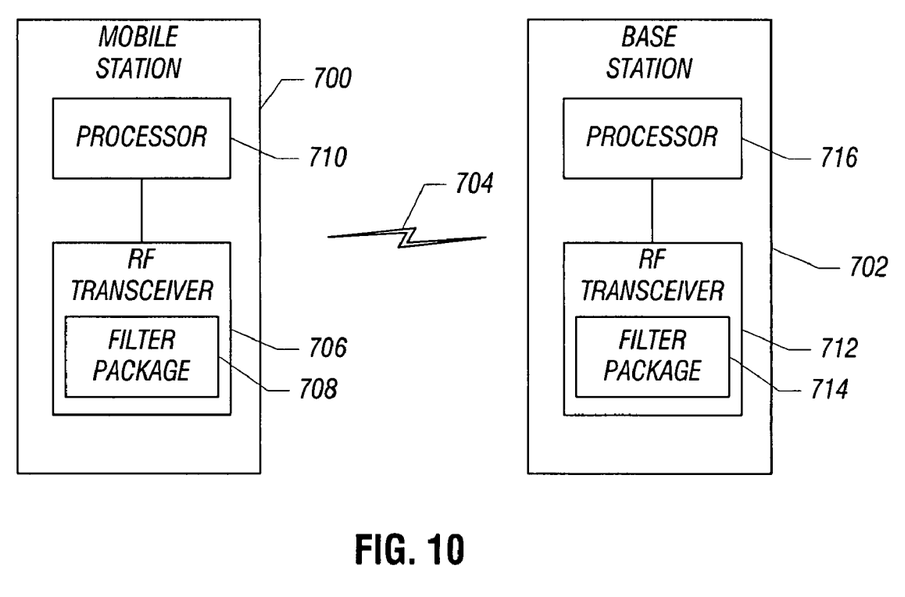
FIG. 10 is a block diagram of an example arrangement including a mobile station and a base station in a wireless communications network, where at least one of the mobile station and base station can include a filter package according to some embodiments.

FIG. 10 shows an example arrangement of a wireless communications network that includes a mobile station 700 and a base station 702 that are able to communicate wireless sly, such as using radio frequency (RF) signaling 704, with each other. In accordance with some embodiments, any one of the filter packages can be provided in at least one of the mobile station 700 and base station 702. As depicted in FIG. 10, a filter package 708 is provided in an RF transceiver 706 of the mobile station, while a filter package 714 is provided in an RF transceiver 712 of the base station 702. The RF transceivers 706, 712 are electrically connected to processors 710, 716 in the respective mobile station 700 and base station 702. The processor 710, RF transceiver 706, and filter package 708 can be provided on a common circuit board, such as that depicted in FIG. 9. Similarly, the processor 716, RF transceiver 712, and filter package 714 of the base station 702 can be provided on a common circuit board.

Each of the mobile station 700 and base station 702 is an example of a wireless communications device. In other applications, filter packages according to some embodiments can be used in other types of electronic devices.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A filter package comprising:
    a support structure;
    a filter device having plural terminals;
    impedance matching circuits formed on the support structure and electrically connected to at least some of the plural terminals of the filter device;
    at least one electrical ground structure electrically connected to the impedance matching circuits, wherein the at least one electrical ground structure is electrically connected to the impedance matching circuits using one or more of: (1) wire bonding the at least one electrical ground structure to the impedance matching circuits, and (2) electrically contacting the at least one electrical ground structure to the impedance matching circuits; and
    an outer housing containing the support structure, the filter device, the impedance matching circuits, and the at least one electrical ground structure,
    wherein the electrical ground structure includes a ground plane having openings, and wherein the impedance matching circuits include impedance matching lines provided in the corresponding openings of the ground plane so that the impedance matching lines are in a same plane as the ground plane.

2. The filter package of claim 1, wherein the support structure comprises a substrate carrier mounted on a base provided inside the outer housing, and wherein the impedance matching circuits are provided on the substrate carrier.

3. The filter package of claim 1, wherein the support structure comprises an internal surface of the outer housing, and wherein the impedance matching circuits are provided on the internal surface of the outer housing.

4. The filter package of claim 1, wherein the support structure has a top surface and a bottom surface, and wherein the impedance matching circuits are provided on at least one of the top and bottom surfaces.

5. The filter package of claim 4, wherein the impedance matching circuits are provided on the top surface of the support structure and on the bottom surface of the support structure.

6. The filter package of claim 1, further comprising:
    input and output transmission lines formed on the support structure to provide an input signal to, and output signal from, the filter device; and
    leadframe pads electrically connected by bond wires to the input and output transmission lines and to the electrical ground structure.

7. The filter package of claim 1, wherein the impedance matching transmission lines are formed on a surface of the support structure, wherein electrical lengths of the impedance matching transmission lines are tuned for corresponding ones of the at least some plural terminals.

8. The filter package of claim 7, wherein the at least one electrical ground structure comprises a ground plane provided on the surface of the support structure, and wherein end portions of the impedance matching transmission lines are electrically contacted to the ground plane.

9. The filter package of claim 1, wherein the filter device is a high frequency filter device.

10. The filter package of claim 9, wherein the filter device is configured to be used at frequencies of at least 1 GHz.

11. The filter package of claim 1, wherein at least one of the impedance matching lines is connected to a discrete matching component.

12. The filter package of claim 11, wherein at least one of the impedance matching lines is connected to a discrete capacitor component.

13. The filter package of claim 11, wherein at least one of the impedance matching lines is connected to a discrete inductor component.

14. The filter package of claim 11, wherein at least one of the impedance matching lines is connected to a discrete resistor component.

15. The filter package of claim 1, wherein the filter package provides a band pass filter function.

16. The filter package of claim 1, wherein the filter package provides a band reject filter function.

17. The filter package of claim 1, wherein the filter package provides a low pass filter function.

18. The filter package of claim 1, wherein the filter package provides a high pass filter function.

19. The filter package of claim 1, wherein the filter device is as surface acoustic wave filter device.

20. The filter package of claim 1, wherein the filter device is a bulk acoustic wave filter device.

* * * * *